United States Patent [19]
Ohtsuki

[11] Patent Number: 5,336,912
[45] Date of Patent: Aug. 9, 1994

[54] BURIED PLATE TYPE DRAM

[75] Inventor: Sumito Ohtsuki, Matsudo, Japan

[73] Assignee: Kabushiki Kaisha Toshiba, Kawasaki, Japan

[21] Appl. No.: 90,261

[22] Filed: Jul. 13, 1993

[30] Foreign Application Priority Data

Jul. 13, 1992 [JP] Japan .................. 4-208477

[51] Int. Cl.⁵ .............. H01L 29/68; H01L 29/78; H01L 29/92
[52] U.S. Cl. .............. 257/304; 257/301; 257/305; 257/311
[58] Field of Search .......... 257/301, 304, 305, 311, 257/905

[56] References Cited

U.S. PATENT DOCUMENTS

| | | | |
|---|---|---|---|
| 4,763,179 | 8/1988 | Tsubouchi | 257/301 |
| 5,079,615 | 1/1992 | Yamazaki et al. | 357/51 |

FOREIGN PATENT DOCUMENTS

| | | | |
|---|---|---|---|
| 60-176265 | 9/1985 | Japan | 257/304 |
| 60-245161 | 12/1985 | Japan | 257/304 |
| 62-40759 | 2/1987 | Japan | 257/304 |
| 4-107858 | 4/1992 | Japan | 257/301 |
| 4-287366 | 10/1992 | Japan | 257/301 |

*Primary Examiner*—Ngan Van Ngo
*Attorney, Agent, or Firm*—Banner, Birch, McKie & Beckett

[57] ABSTRACT

A trench of a buried plate type DRAM has a bottom portion wider than an opening portion. A silicon oxide film is formed on an upper portion of the side wall of the trench. An N-type impurity diffusion region is formed around the bottom portion of the trench. Impurity diffusion regions of adjacent trenches are integrally connected with each other as one portion. A first polycrystalline silicon layer is formed on the impurity diffusion region in the trench and the silicon oxide film. The polycrystalline silicon layer is coated with a laminated film consisting of a silicon nitride film and a silicon oxide film. The trench is filled with a second polycrystalline silicon layer covering the laminated film. The impurity diffusion region serves as a plate diffusion region of a capacitor, the first polycrystalline silicon layer serves as a plate electrode, the laminated film serves as a capacitor insulating film, and the second polycrystalline silicon layer serves as a storage node electrode. The capacitor is formed in the trench.

8 Claims, 5 Drawing Sheets

BURIED PLATE TYPE DRAM

BACKGROUND OF THE INVENTION

1. Field of the Invention

The present invention relates generally to a semiconductor memory device and a method of manufacturing the same, and more particularly to a buried plate type DRAM (dynamic random access memory) and a method of manufacturing the same.

2. Description of the Related Art

Recently, as the capacity of a semiconductor memory device such as a DRAM is increased year by year, various devices have been proposed to increase the integration density of a memory. A 1-transistor 1-capacitor cell structure is generally known as a memory cell for use in a DRAM. A 3-transistor cell and a 4-transistor cell are also known. The 1-transistor 1-capacitor cell is most suitable for high integration, since one memory cell is constituted by a small number of elements. Various types of DRAM having a 1-transistor 1-capacitor cell such as a planar type, stacked type and buried plate type are known as improved memories to obtain a large mount of memory capacity with a small capacitor. The buried plate type DRAM is disclosed in, for example, IEEE TRANSACTIONS ON ELECTRON DEVICES, Vol. 35, No. 8, August 1988, pp. 1257–1261, "Half-Vcc Sheath-Plate Capacitor DRAM Cell with Self-Aligned Buried Plate Wiring", Kaga et al.

A memory cell of a buried plate type DRAM is an example of arrangement in which a storage capacitance is formed three-dimensionally. In the memory cell, a deep trench is formed in a silicon substrate in a direction perpendicular to the main surface thereof and a memory capacitor is formed on the side wall of the trench. Therefore, the cell area can be smaller and the memory capacity can be greater as compared to the planar type DRAM. Further, in the planer type or stacked type DRAM, since a greater step is formed on the substrate surface as the cell area is smaller, a wiring layer formed on the substrate surface may be cut at the step. On the other hand, in the buried plate type DRAM, since the plate electrode of a capacitor is buried in the semiconductor substrate, the surface of a semiconductor body is flat and the patterning accuracy of a wiring layer is increased.

According to a conventional method of manufacturing a memory cell of the buried plate type DRAM, an impurity such as As or P is ion-injected into a bottom portion of a trench, and then the bottom portion is heated for a long period of time, to diffuse the injected impurity and connect plate diffusion regions of adjacent trenches. However, for this purpose, thermal diffusion for a long period of time and impurity injection with high energy are required. As a result, the heat may adversely affect the other active regions (impurity diffusion layers). To avoid the thermal influence, it is well known a method of forming a buried region serving as a plate diffusion region on a semiconductor substrate by epitaxial growth, instead of forming a plate diffusion region by diffusing an impurity through a bottom portion of a trench. However, this method lowers manufacturing yield of memory cells and requires high cost. In addition, since the area at which a plate diffusion region is in contact with a plate electrode is relatively small, an apparent plate resistance is increased and an operation margin is decreased.

SUMMARY OF THE INVENTION

Accordingly, a first object of the present invention is to provide a semiconductor memory device in which a large memory capacity and a high integration density are simultaneously achieved.

A second object of the present invention is to provide a semiconductor memory device in which the area at which a plate diffusion region is in contact with a plate electrode is relatively large.

A third object of the present invention is to provide a method of manufacturing a semiconductor memory device in which a large memory capacity and a high integration density are simultaneously achieved.

A fourth object of the present invention is to provide a method of manufacturing a semiconductor memory device in which the area at which a plate diffusion region is in contact with a plate electrode is relatively large.

A fifth object of the present invention is to provide a method of manufacturing a semiconductor memory device at low cost.

The first and second objects are achieved by a semiconductor memory device comprising:
a semiconductor substrate of a first conductivity type.
a trench formed in a main surface of the semiconductor substrate and having a region wider than an opening portion thereof;
a first insulating layer formed on a side wall of the trench;
an impurity diffusion region of a second conductivity type formed around a bottom portion of the trench in the semiconductor substrate;
a first conductive layer formed on the impurity diffusion region and the first insulating layer in the trench;
a second insulating layer covering the first conductive layer; and
a second conductive layer covering the second insulating layer and filled in the trench.

With the above structure, since the lower portion of the trench is wider than the opening thereof, the surface area within the trench is relatively large, and the capacitor formed on the side wall of the trench has a relatively large capacitance. Accordingly, since the area at which a plate diffusion region is in contact with a plate electrode is increased, the operation margin is improved.

The third to fifth objects are achieved by a method of manufacturing a semiconductor memory device comprising the steps of:
forming a trench in a semiconductor substrate of a first conductivity type;
forming a first insulating layer on a side wall of the trench;
forming a region wider than an opening portion in the trench;
forming a first impurity diffusion region of a second conductivity type so as to surround a bottom portion of the trench in the semiconductor substrate;
forming a first conductive layer on the impurity diffusion region and the first insulating layer in the trench;
forming a second insulating layer covering the first conductive layer; and
forming a second conductive layer covering the second insulating layer and filled in the trench.

With the above method, since the lower portion of the trench is wider than the opening thereof, the surface area within the trench is relatively large, and the capacitor formed on the side wall of the trench has a relatively large capacitance. Further, since the distance between adjacent trenches is greater in the lower portion than in the upper portion, when an impurity is ion-injected into a bottom portion of the trenches to form plate diffusion regions by thermal diffusion, the plate diffusion regions of the adjacent trenches can be connected with each other in a short period of time. Therefore, the influence of heat on the other active regions can be reduced. In addition, since the epitaxial growth method is not employed, memory devices can be manufactured at high yield with low cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
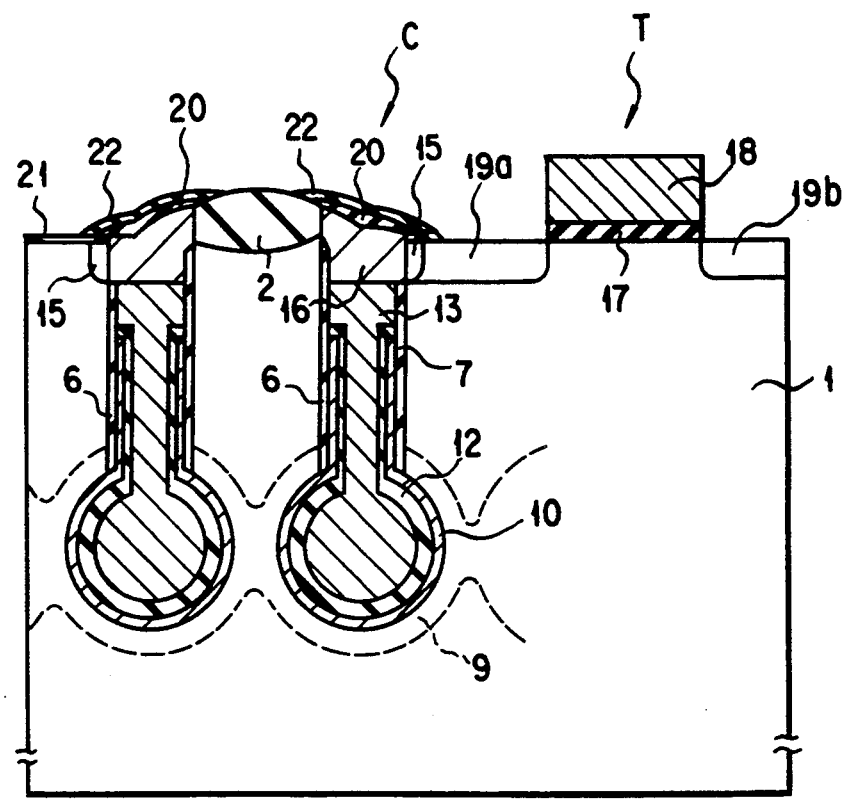
FIG. 1 is a cross-sectional view of a memory cell of a buried plate type DRAM for explaining a semiconductor memory device according to a first embodiment of the present invention
Figure 2:
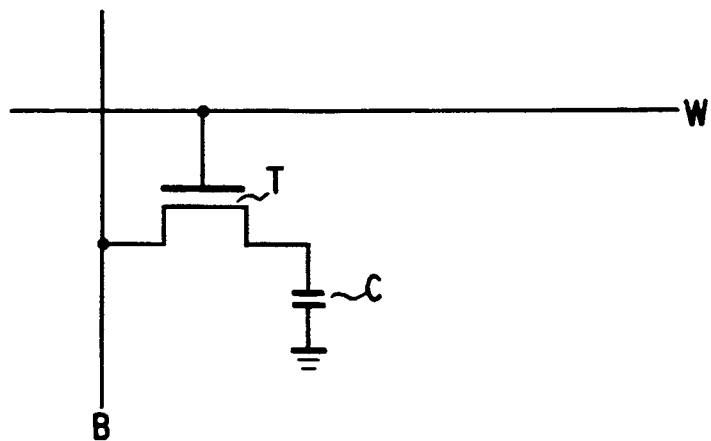
FIG. 2 is a circuit diagram showing the memory cell shown in FIG. 1.
Figure 3:
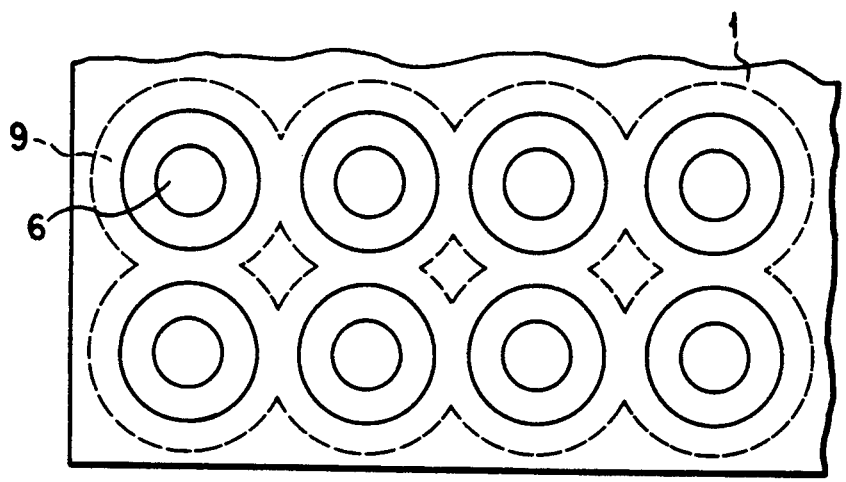
FIG. 3 is a plan view of the memory cell array pattern of the DRAM shown in FIG. 1.

FIGS. 1 to 3 show a semiconductor memory device according to a first embodiment of the present invention. FIG. 1 is a cross sectional view of a buried plate type DRAM, showing 1-transistor 1-capacitor memory cell; FIG. 2 is a circuit diagram showing the memory cell shown in FIG. 1; and FIG. 3 is a plan view of the memory cell array pattern.

As shown in FIG. 2, a memory cell comprises a selection MOS transistor T and a memory capacitor C. The gate of the MOS transistor T is connected to a word line w, one of the source and the drain regions is connected to a bit line B, and the other is connected to the storage node electrode of the capacitor C. The plate electrode of the capacitor C is grounded.

As shown in FIG. 1, a field oxide film 2 for isolating element regions is formed on the main surface of a silicon substrate (semiconductor substrate) 1 made of, for example, P type. In each element region, the capacitor C formed in a trench 6 and the MOS transistor T are formed in a main surface region of the silicon substrate 1. The diameter of the trench 6 varies in accordance with the depth, i.e., the diameter is greater in the lower portion and smaller near the opening. A silicon oxide film 7 is formed on an upper portion of the side wall of the trench 6, and not on a lower and bottom portions thereof. An N-type impurity diffusion region 9 of a low impurity concentration is formed around the lower portion of the trench 6 in the semiconductor substrate 1. A conductive layer made of a polycrystalline silicon layer 10 or the like is formed on the inner surface of the trench 6. A capacitor insulating film 12 made of a silicon nitride film and a silicon oxide film is formed on the polycrystalline silicon layer 10. The trench 6 is filled with a conductive material such as a polycrystalline silicon 13 and the like, thus forming a capacitor C. The polycrystalline silicon layer 10 and the polycrystalline silicon 13 respectively serve as a plate electrode and a storage node electrode of the capacitor C. As shown in FIG. 3, an N-type impurity diffusion region 9 is connected with another N-type impurity diffusion region 9 of an adjacent trench 6 and serves as a plate diffusion region.

A polycrystalline silicon layer 16 for connecting the MOS transistor T and the capacitor C is formed on the polycrystalline silicon 13 buried in the trench 6, so that a portion of the polycrystalline silicon layer 16 is exposed above the silicon substrate 1. The exposed portion of the polycrystalline silicon layer 16 is covered by silicon oxide films 20 and 22.

Source and drain regions 19a and 19b of the MOS transistor T, spaced apart from each other, are formed adjacent to the trench 6 in the substrate 1. An N-type impurity diffusion region 15 of a high impurity concentration is formed in the region 19a along the side wall of the trench 6. The region 15 is electrically connected to the polycrystalline silicon layer 16. A gate insulating film 17 is formed on a portion of the substrate 1 between the source and drain regions 19a and 19b. A gate electrode 18 is formed on the gate insulating film 17.

The source of the MOS transistor T and one of the source and drain regions 19a and 19b shown in FIG. 1 are connected to the bit line B (FIG. 2), to which a voltage of about 5 V is applied. However, if there is a possibility of a higher voltage being applied to the bit line B, an LDD (lightly doped drain) structure can be employed, in which an impurity diffusion region of a low impurity concentration is added to a boundary between a channel region and at least one of the regions 19a and 19b.

Figure 4:
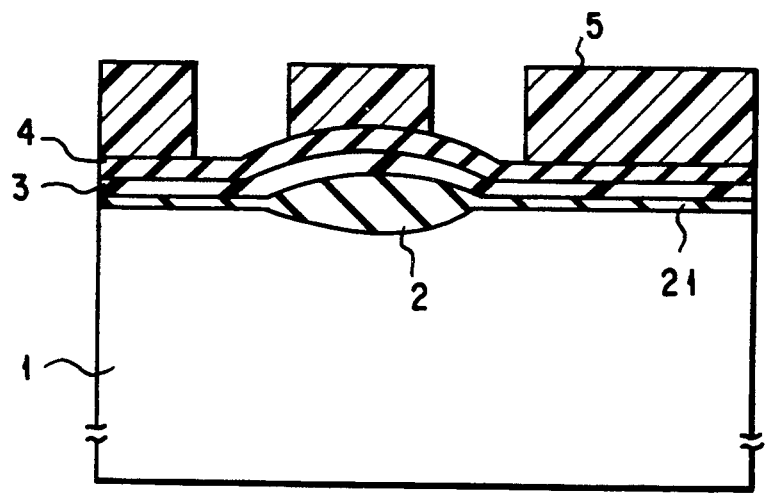
FIGS. 4 to 11 are cross-sectional views sequentially showing the steps of manufacturing the memory cell shown in FIG. 1.

A method of manufacturing the DRAM shown in FIG. 1 will now be described in detail with reference to FIGS. 4 to 11. First, as shown in FIG. 4, the main surface of the P-type silicon substrate 1 is thermal-oxidized, thereby forming a thin oxide film 21. Then, an element isolating field oxide film 2 is formed on the oxide film 21 by a selective oxidation technique such as the LOCOS method. On the resultant structure, a CVD silicon oxide film $(SiO_2)_3$ of a thickness of about 1000 Å and a silicon nitride film $(Si_3N_4)_4$ of a thickness of about 6000 Å are formed in sequence. Subsequently, a photoresist is coated on the silicon nitride film 4 and exposed and developed, thereby forming a photoresist pattern 5.

Figure 5:
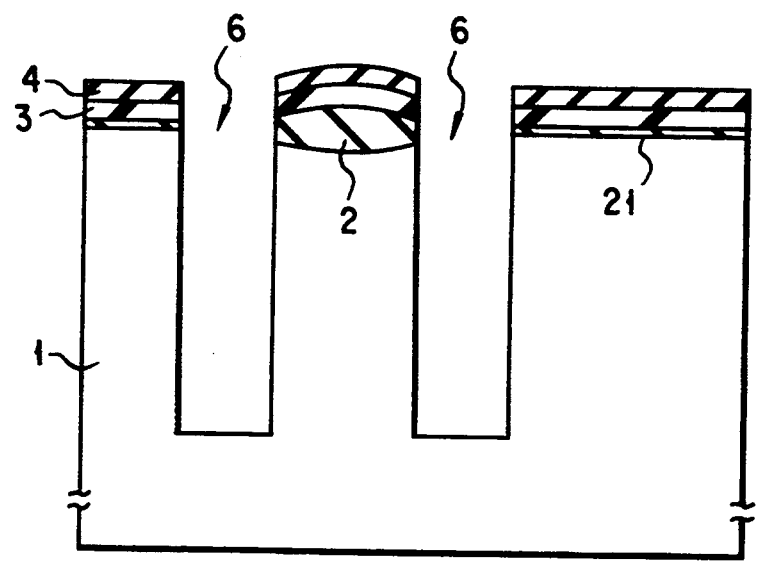

Using the photoresist pattern 5 as a mask, the silicon nitride film 4 and the CVD silicon oxide film 3 are removed by an anisotropic etching method such as the RIE (reactive ion etching) method, with the result that part of the silicon substrate 1 is exposed. Thereafter, the photoresist pattern 5 is removed. Using the silicon nitride film 4 and the CVD silicon oxide film 3 as a mask, the silicon substrate 1 is etched about 4 μm by the RIE method. Thus, a trench 6 is formed as shown in FIG. 5.

Figure 6:
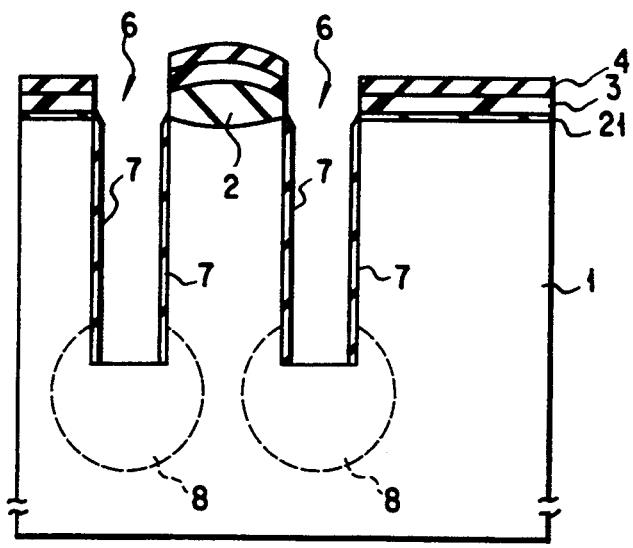

Subsequently, as shown in FIG. 6, the exposed surface of the silicon substrate 1 is thermal-oxidized at a temperature of about 900° C. for about 30 minutes. As result, a silicon oxide film having a thickness of about 500 Å is formed on the side wall and the bottom of the trench 6. The silicon oxide film on the bottom of the trench 6 is removed by the RIE method. Then, arsenic (As) is ion-injected through the bottom of the trench 6 under the conditions of an accelerating voltage of 40 KeV and a dose of $10^{15}$ cm$^{-2}$. Subsequently, the substrate is heated in an $N_2$ atmosphere at a temperature of about 900° C. for about 30 minutes, thereby forming an N-type impurity diffusion region 8 of a high concentration, in the substrate 1 near the bottom portion of the trench 6. Since the etching rate of the N-type impurity diffusion region 8 is high, the substrate 1 can be etched easily in the next step. In addition, the shape of the trench can be controlled by virtue of the N-type impurity diffusion region 8.

Figure 7:
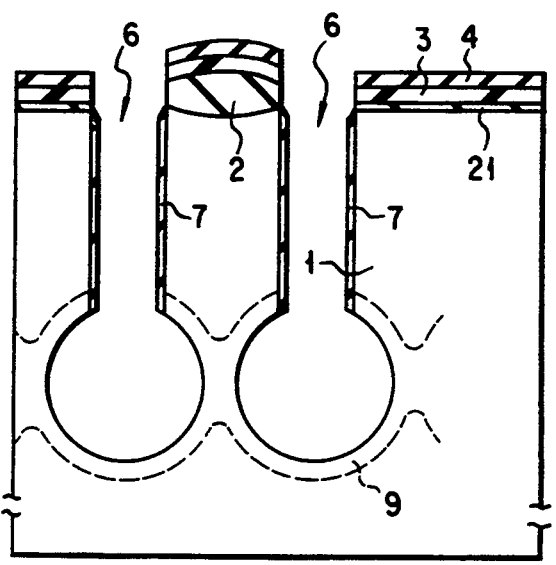

Then, as shown in FIG. 7, the bottom of the trench 6 is etched by an isotropic etching such as the CDE (chemical dry etching) method. In this step, the etching progresses circularly along the impurity diffusion region 8. As a result, the bottom portion of the trench 6 is more expanded as compared to the opening portion thereof. Thereafter, for example, As is ion-injected through the trench 6 under the conditions of an accelerating voltage of 40 KeV and a dose of $10^{15}$ cm$^{-2}$. Subsequently, the substrate is heated in an $N_2$ atmosphere at a temperature of about 900° C. for about 30 minutes, thereby forming an N-type impurity diffusion region 9 of a concentration of about $2 \times 10^{19}$ cm$^{-3}$ around the bottom portion of the trench 6. In this step, the N-type impurity diffusion region 9 is connected with another N-type impurity diffusion region 9 formed under the adjacent trench 6. The impurity concentration of the N-type impurity diffusion region 9 is preferably $1 \times 10^{16}$ cm$^{-3}$ to $1 \times 10^{22}$ cm$^{-3}$.

Figure 8:
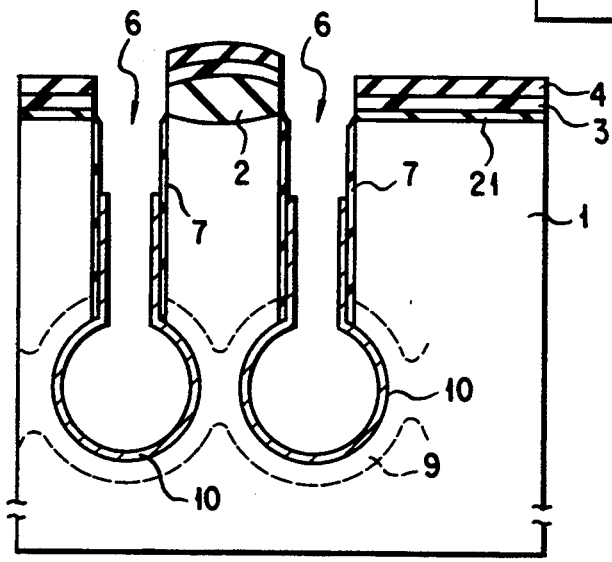

Thereafter, an N-type polycrystalline silicon layer of a thickness of about 100 Å is formed on the resultant structure. The silicon layer is etched using a photoresist pattern (not shown) as a mask covering the inner surface of the trench 6. As a result, an N-type polycrystalline silicon layer 10 remains on the inner surface of the trench 6, as shown in FIG. 8. The polycrystalline silicon layer 10 serves as a plate electrode of the capacitor C.

Figure 9:
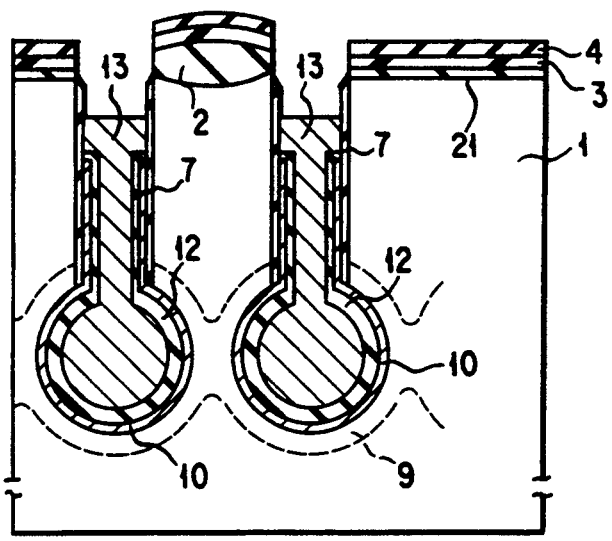

As shown in FIG. 9, a silicon nitride film of a thickness of about 100 Å is deposited on the polycrystalline silicon layer 10 in the trench 6. The silicon nitride film is thermal-oxidized, thereby forming a silicon oxide film of a thickness of about 20 Å on the silicon nitride film. Thus, a laminated film 12 made of $Si_3N_4$ and $SiO_2$ is formed on the layer 10. The laminated film 12 serves as an insulating film of the capacitor C.

Then, an N-type polycrystalline silicon of a thickness of about 6000 Å is deposited on the resultant structure. Using a photoresist as a mask to cover the trench 6, this polycrystalline silicon is etched by the CDE method. As a result, the trench 6, except for its opening portion, is filled with an N-type polycrystalline silicon 13. The N-type polycrystalline silicon 13 serves as a storage node electrode of the capacitor C.

Figure 10:
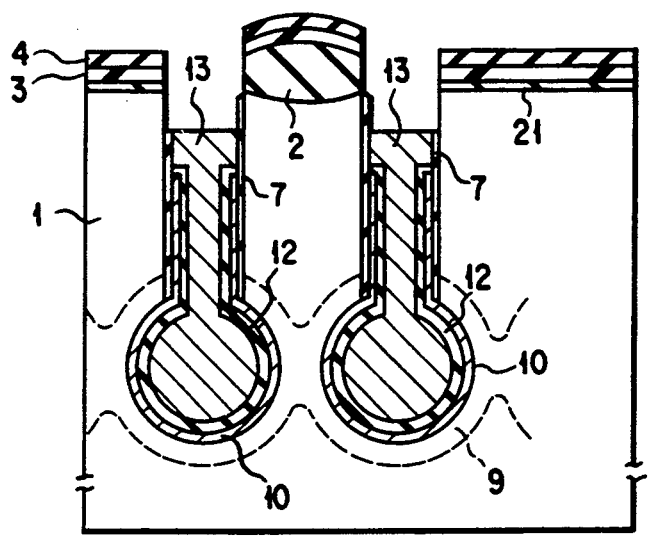
Figure 11:
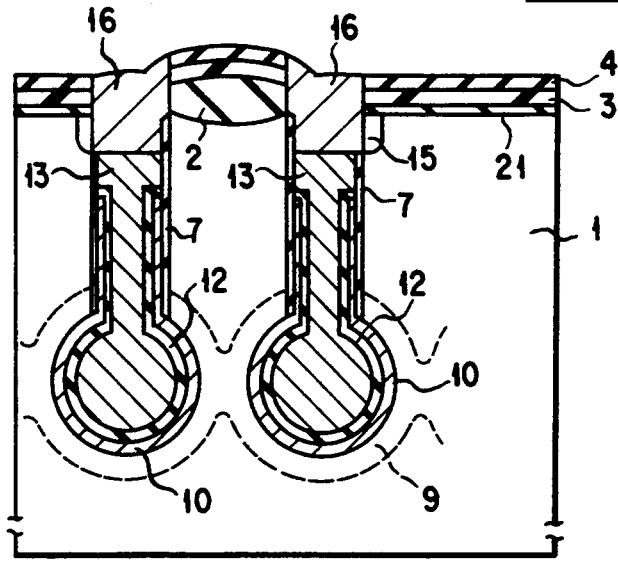

Thereafter, a photoresist (not shown) is coated on the resultant structure and patterned by exposure and development so that only a trench edge portion of the silicon oxide film which is apart from the field oxide film 2 is exposed. Then, the exposed portion of the silicon oxide film 7 is removed by the CDE method. As a result, a portion of the silicon substrate 1 of the trench edge portion is exposed as shown in FIG. 10. In this state, for example, phosphorous is ion-injected slant to the main surface of the silicon substrate 1 under the conditions of an accelerating voltage of 100 KeV and a dose of $1 \times 10^{15}$ cm$^{-2}$, thereby forming an N-type impurity diffusion region 15 on the trench edge portion in the silicon substrate 1. An N-type polycrystalline silicon layer having a thickness of about 3000 Å is formed on the resultant structure. A photoresist pattern (not shown) covering the trench 6 is formed on the polycrystalline silicon layer, which is etched by the CDE method so that the trench 6 is filled with an N-type polycrystalline silicon layer 16.

Subsequently, the resultant structure is subjected to wet etching, thereby removing the silicon nitride film 4 and the CVD silicon oxide film 3 on the silicon substrate 1. The exposed surface of the polycrystalline silicon layer 16 is thermal-oxidized at a temperature of 900° C., with the result that a silicon oxide film 20 is formed (see FIG. 1). The resultant structure is coated with photoresist, which is exposed and developed, thereby forming a photoresist pattern (not shown) covering the trench 6 and the field oxide film 2. Using the photoresist pattern as a mask, the oxide film 20 and the thin oxide film 21 are etched, so that an MOS transistor T forming region of the silicon substrate 1 is exposed. Thereafter, a gate oxide film 17 is formed on the region of the substrate 1 by a known method and a gate electrode 18 made of polycrystalline silicon is formed on the gate oxide film 17. An impurity is ion-injected into the substrate 1 using the gate electrode 18 as a mask and diffused by thermal treatment, thereby forming source and drain regions 19a and 19b. The N-type impurity diffusion region 15 is brought into contact with one of the source and drain regions 19a and 19b and functions as the source or drain. A silicon oxide film 22 is formed on the silicon oxide film 20, which has been formed by oxidizing the surface of the polycrystalline silicon layer 16, so that the surface of the film 20 is stabilized. In this manner, the 1-transistor 1-capacitor memory cell as shown in FIG. 1 is formed.

Figure 12:
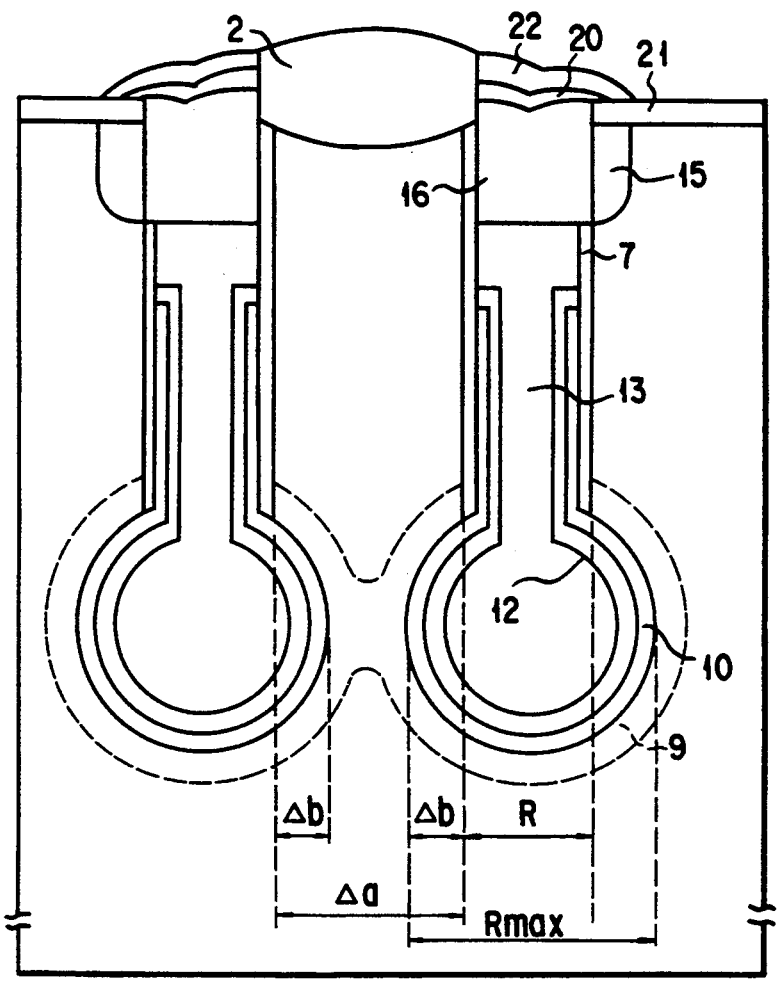
FIG. 12 is a cross-sectional view of a trench portion of the memory cell for explaining an effect of the present invention.

The advantage obtained by the above-mentioned shape of the trench and the manufacturing method will now be described in detail with reference to FIG. 12. The upper portion of the trench including the opening portion is like a cylinder of a diameter of R, while the lower portion thereof including the bottom portion is like a sphere of a diameter of $R_{max}$. The capacitor formed in the trench 6 of the above-described shape has a greater capacitance than the capacitor formed in the cylindrical trench of the conventional device. Therefore, the integration density can be increased, keeping a large capacitance. In addition, since the surface area of the trench 6 is large, the area at which the plate diffusion region 9 is in contact with the plate electrode 10 is relatively large. Hence, the operation margin is kept high, although the plate electrode 10 is buried in the trench 6. Moreover, since the epitaxial growth method is not employed, memory devices can be manufactured at high yield with low cost. Further, assuming that the distance between adjacent trenches in a conventional device is Δa, the distance between the upper portions of adjacent trenches of the above embodiment is also Δa. However, as shown in FIG. 12, since the radius of the lower portion is Δb greater than that of the upper portion, the distance between the lower portions of the adjacent trenches is as small as Δa-2Δb. Hence, a plurality of plate diffusion regions 9 surrounding the lower portions of the trenches can be integrally connected by heat treatment of a shorter period of time. Therefore, the heat treatment does not adversely affect the other active regions. The lower portion of the trench has the maximum diameter $R_{max}$.

The present invention is not limited to the above embodiment, but can be variously modified. For example, in the step of forming the trench 6 of the above embodiment, an N-type impurity diffusion region 8 is formed in the bottom portion of the trench 6 before the anisotropic etching. However, the region 8 is not necessarily formed. If the region 8 is not formed, the section of the bottom portion of the trench 6 has a substantially lateral elliptic shape. In addition, the trench 6 of the above embodiment has a depth of about 5 μm, but it is possible to use a trench having a depth of 4 to 16 μm. The deeper the trench, the greater the capacitance of the capacitor. However, it is difficult to form a deep trench. Further, the gate electrode is formed of polycrystalline silicon in the above embodiment; however it can be formed of a high-melting point metal such as Mo, W, or Ta, a silicide thereof, or a polycide in which a silicide and polycrystalline silicon are laminated. Furthermore, a P-type silicon substrate is used as a semiconductor substrate in the above embodiment; however, it can be replaced with an N-type silicon substrate or any semiconductor other than silicon. The present invention has been described, referring to a 1-transistor 1-capacitor cell DRAM. However, the present invention can be applied to a 3-transistor cell or 4-transistor cell, as long as the cell has a capacitor formed in a trench.

Figure 13:
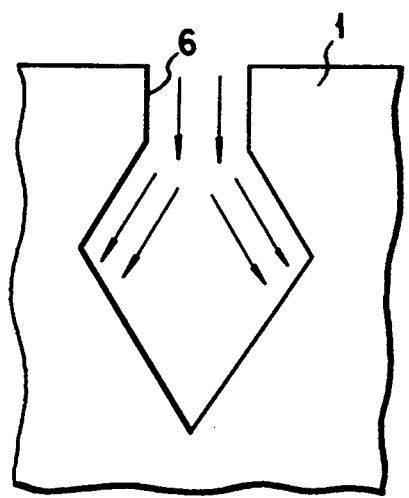
FIG. 13 is a cross-sectional view of a trench of another shape formed by another method, for explaining a semiconductor memory device according to a second embodiment of the present invention.
Figure 14:
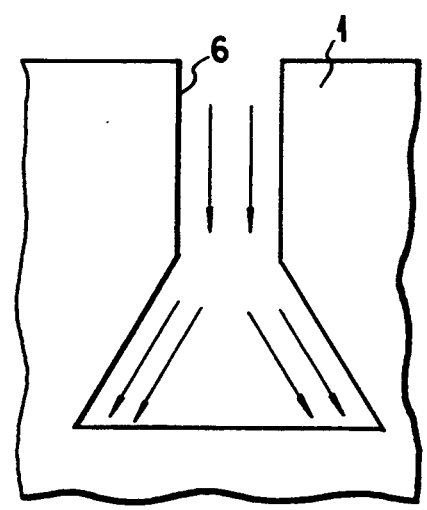
FIG. 14 is a cross-sectional view of a trench of still another shape formed by still another method, for explaining a semiconductor memory device according to a third embodiment of the present invention.

FIGS. 13 and 14 show semiconductor memory devices according to second and third embodiments of the present invention, respectively. The trenches of these embodiments have different cross sections and formed by different ways from those of the first embodiment. More specifically, in the first embodiment, anisotropic etching is first performed to form a trench and isotropic etching is thereafter performed to increase the diameter of a bottom portion of the trench. In contrast, according to the second and third embodiments, the silicon substrate 1 is first etched vertically by anisotropic etching and thereafter the etching angle is changed to expand the bottom portion of the trench. The other portions of the structure and the manufacturing steps are the same as those in the first embodiment. A trench formed by the method of the second and third embodiments has a shape different from that of the first embodiment. The cross sections of the lower portions of the trenches shown in FIGS. 13 and 14 are like a diamond and a triangle flask, respectively.

With the methods of the second and third embodiments, since a trench having a wider bottom portion can be formed only by anisotropic etching, the manufacturing steps can be simplified and the same effect as in the first embodiment can be obtained.

What is claimed is:
1. A semiconductor memory device comprising:
 a semiconductor substrate of a first conductivity type;
 a trench formed in a main surface of the semiconductor substrate and having a region wider than an opening portion thereof;
 a first insulating layer formed on a side wall of the trench;
 an impurity diffusion region of a second conductivity type formed around a bottom portion of the trench in the semiconductor substrate;
 a first conductive layer formed on the impurity diffusion region and the first insulating layer in the trench;
 a second insulating layer covering the first conductive layer; and
 a second conductive layer covering the second insulating layer and filled in the trench.

2. A semiconductor memory device according to claim 1, wherein the impurity diffusion region serves as a plate diffusion region of a capacitor, the first conductive layer serves as a plate electrode of the capacitor, the second insulating layer serves as an insulating film of the capacitor, the second conductive layer serves as a storage node electrode of the capacitor, and the capacitor is formed in the trench.

3. A semiconductor memory device according to claim 2, further comprising a selection MOS transistor formed in the semiconductor substrate and connected to the capacitor.

4. A semiconductor memory device according to claim 3, wherein the MOS transistor includes source and drain regions formed in the semiconductor substrate, a gate insulating film formed between the source and drain regions on the semiconductor substrate, and a gate electrode formed on the gate insulating film, and one of the source and drain regions is electrically connected to the second conductive layer.

5. A semiconductor memory device comprising:
 a semiconductor substrate of a first conductivity type;
 a plurality of trenches, spaced apart from each other, formed in a main surface of the semiconductor substrate, each of the trenches having a region wider than an opening portion thereof;
 a plurality of first insulating layers formed on side walls of the trenches;
 an impurity diffusion region of a second conductivity type formed around bottom portions of the trenches in the semiconductor substrate;
 a plurality of first conductive layers formed on the impurity diffusion region and the first insulating layers in the trenches;
 a plurality of second insulating layers covering the first conductive layers; and
 a plurality of second conductive layers covering the second insulating layers and filled in the trenches.

6. A semiconductor memory device according to claim 5, wherein the impurity diffusion region serves as a plate diffusion region of a plurality of capacitors, the first conductive layers serve as plate electrodes of the capacitor, the second insulating layers serve as insulating films of the capacitors, the second conductive layers serve as storage node electrodes of the capacitors, and the capacitors are formed in the respective trenches.

7. A semiconductor memory device according to claim 6, further comprising a plurality of selection MOS transistors formed in the semiconductor substrate and connected to the respective capacitors.

8. A semiconductor memory device according to claim 7, wherein each of the MOS transistors includes source and drain regions formed in the semiconductor substrate, a gate insulating film formed between the source and drain regions on the semiconductor substrate, and a gate electrode formed on the gate insulating film, and one of the source and drain regions is electrically connected to one of the second conductive layers.

* * * * *